US008070265B2

(12) United States Patent
Guan et al.

(10) Patent No.: US 8,070,265 B2
(45) Date of Patent: Dec. 6, 2011

(54) HEATER STACK IN A MICRO-FLUID EJECTION DEVICE AND METHOD FOR FORMING FLOATING ELECTRICAL HEATER ELEMENT IN THE HEATER STACK

(75) Inventors: Yimin Guan, Lexington, KY (US); Zachary Justin Reitmeier, Lexington, KY (US); Carl Edmond Sullivan, Stamping Ground, KY (US)

(73) Assignee: Lexmark International, Inc., Lexington, KY (US)

( * ) Notice: Subject to any disclaimer, the term of this patent is extended or adjusted under 35 U.S.C. 154(b) by 332 days.

(21) Appl. No.: 12/345,788

(22) Filed: Dec. 30, 2008

(65) Prior Publication Data

US 2010/0165056 A1 Jul. 1, 2010

(51) Int. Cl.
*B41J 2/14* (2006.01)
*B41J 2/04* (2006.01)
*H01L 21/3213* (2006.01)

(52) U.S. Cl. ................. 347/64; 347/54; 347/56; 438/21

(58) Field of Classification Search ........................ None
See application file for complete search history.

(56) References Cited

U.S. PATENT DOCUMENTS 7,182,439 B2 2/2007 Silverbrook
7,195,343 B2 3/2007 Anderson
2002/0093548 A1 * 7/2002 Jarrold et al. .................. 347/54

OTHER PUBLICATIONS

Introduction to Microelectronic Fabrication: Modular Series on Solid State Devices; vol. V, pp. 269-280; Richard C. Jaeger, Auburn University, published Oct. 17, 2011.

* cited by examiner

*Primary Examiner* — Matthew Luu
*Assistant Examiner* — Lisa Solomon

(57) ABSTRACT

A method for forming a floating heater element includes processing a silicon substrate to form a heater stack having the heater element on the substrate with peripheral edge portions, processing the heater stack by depositing and patterning a layer of photoresist or hard mask thereon to substantially mask the heater stack and form a trench through the photoresist or hard mask exposing a surface area of the substrate extending along the peripheral edge portions of the heater element, and processing the masked heater stack and exposed surface area of the substrate by sequentially removing the photoresist and portions of the substrate at the exposed surface area and that underlie the heater element so as to create a well in the substrate undercutting the heater element and open along the peripheral edge portions thereof, the well being capable of filling with a fluid so as to produce the floating heater element.

6 Claims, 4 Drawing Sheets

HEATER STACK IN A MICRO-FLUID EJECTION DEVICE AND METHOD FOR FORMING FLOATING ELECTRICAL HEATER ELEMENT IN THE HEATER STACK

BACKGROUND

1. Field of the Invention

The present invention relates generally to micro-fluid ejection devices and, more particularly, to a heater stack in a micro-fluid ejection device and a method for forming a floating electrical heater element in the heater stack.

2. Description of the Related Art

Micro-fluid ejection devices have had many uses for a number of years. A common use is in a thermal inkjet printhead in the form of a heater chip. In addition to the heater chip, the inkjet printhead basically includes a source of supply of ink, a nozzle plate attached to or integrated with the heater chip, and an input/output connector, such as a tape automated bond circuit, for electrically connecting the heater chip to a printer during use. The heater chip is made up of a plurality of resistive heater elements, each being part of a heater stack. The term "heater stack" generally refers to the structure associated with the thickness of the heater chip that includes first, or heater forming, strata made up of resistive and conductive materials in the form of layers or films on a substrate of silicon or the like and second, or protective, strata made up of passivation and cavitation materials in the form of layers or films on the first strata, all fabricated by well-known processes of deposition, patterning and etching upon the substrate of silicon. The heater stack also has one or more fluid vias or slots that are cut or etched through the thickness of the silicon substrate and the first and second strata, using these well-known processes, serve to fluidly connect the supply of ink to the heater stacks. A heater stack having this general construction is disclosed as prior art in U.S. Pat. No. 7,195,343, which patent is assigned to the assignee of the present invention. The disclosure of this patent is hereby incorporated by reference herein.

Despite their seeming simplicity, construction of heater stacks requires consideration of many interrelated factors for proper functioning. The current trend for inkjet printing technology (and micro-fluid ejection devices generally) is toward ultra-low energy ejector designs that will provide lower jetting energy, greater ejection frequency, and in the case of printing, higher print speeds. However, a minimum quantity of thermal energy must be present on an external surface of the heater stack, above an electrical resistive heater element therein, in order to vaporize the ink inside an ink chamber between the heater stack external surface and a nozzle in the nozzle plate so that the ink will vaporize and escape or jet through the nozzle in a well-known manner. With current designs, the overall heating energy or "jetting energy" produced by the heater element must pass through the plurality of layers of the first and second strata that form the heater stack before the requisite energy for fluid ejection reaches the external surface of the heater stack. Hence, the input energy to an inkjet heater stack is consumed in several ways. A portion of this energy is transferred to the ink and used beneficially for bubble formation. However, a large percentage of the energy is dissipated in the materials over and under the heater element. Therefore, by minimizing this waste heat into the heater underlayers and/or overcoats, the total required input energy to the heater element can be reduced while still transferring the same amount of energy to the ink.

The realization of ultimate inkjet print quality is influenced by several factors, of which one important driving force is the reduction of droplet size and spacing to the minimum detectable limit of the human eye. However, with current inks, flow features and nozzle materials, ejector and circuit designs, and current thin film materials in heater stacks, printheads are thermally limited due to the extreme heat generated on heater elements. In order to maintain competitive print speeds, the temperature of the heater elements would rapidly rise to >>100° C., eliminating drop-on-demand capability. Conversely, reducing the fire frequency for thermal management purposes would require such a dramatic decrease that the print speed would be extremely slow. Hence, the solution to this dilemma would seem to be to reduce the energy required per heater element fire.

One current approach referred to as a Memjet chip involves a complex process to form a double-sided heater element, i.e. bubbles form on the top and bottom of a heater element on a cantilevered or suspended beam. For instance, see U.S. Pat. No. 7,182,439. While this double-sided heater element does reduce the required energy per fire due to the removal of the thermal mass below the heater element, this approach involves a major departure from the use of conventional inkjet chip fabrication processes and techniques.

Thus, there is a need for an innovation that will assist in achieving an ultra-low energy ejector design while still employing the processes and techniques used in more traditional or conventional inkjet chip fabrication.

SUMMARY OF THE INVENTION

The present invention meets this need by providing an innovation whose differentiating factor, as well as advantage, relative to the Memjet design approach is that a method for forming a floating electrical heater element on a micro-fluid ejection device is devised that is more compatible and easily integrated with the micro-fluid ejection device fabrication processes and techniques used heretofore, such as the currently-used CMOS process. The approach of the method of the present invention provides a substantial reduction in the number of fabrication steps and thus the cost to make the device as compared to the Memjet design approach. The floating electrical heater element formed by the method of the present invention has high thermal efficiency due to reduction of waste heat flow into a mass of the silicon substrate now removed beneath the heater element and increase of bubble nucleation surface area providing more fluid displacement as well as back flow reduction due to bubble nucleation at a backside of the heater element.

Accordingly, in an aspect of the present invention, a method for forming a floating electrical heater element in a micro-fluid ejection device includes processing a silicon substrate to form an electrical heater stack of a micro-fluid ejection device having an electrical heater element formed on the silicon substrate with the electrical heater element having peripheral edge portions extending at anisotropically etchable orientations relative to the silicon substrate and a mask overlying the electrical heater stack to form a trench through the mask that exposes an area of a first surface of the silicon substrate which extends along the peripheral edge portions of the electrical heater element, and processing the masked electrical heater stack and exposed first surface area of the silicon substrate by anisotropically etching sequentially the portions of the silicon substrate at the exposed first surface area thereof and that underlie the electrical heater element so as to create a well in the silicon substrate undercutting the electrical heater element and open along the peripheral edge portions of the electrical heater element, the well capable of filling with a fluid so as to produce, in effect, a floating electrical heater element on the silicon substrate of the electrical heater stack. The method also includes removing portions of the silicon substrate at a second surface opposite from the first surface thereof to produce a via through the silicon substrate to the well therein underneath the electrical heater element having a sidewall extending from the second surface of the silicon substrate toward the first surface thereof and to the well underneath the heater element for centrally supplying fluid into a bottom of the well.

In another aspect of the present invention, a heater stack in a micro-fluid ejection device includes a silicon substrate, a heater substrata of resistive and conductive layers on a front side of the silicon substrate supporting and forming an electrical fluid heater element having peripheral edge portions, an anisotropically etched well formed in the silicon substrate undercutting the electrical heater element and open along the peripheral edge portions of the electrical heater element such that the well is capable of filling with a fluid so as to produce, in effect, a floating electrical heater element on the silicon substrate of the electrical heater stack, and a via formed through the silicon substrate to the well therein underneath the electrical heater element having a sidewall extending from a back side of the silicon substrate toward the front side thereof and to the well underneath the heater element for centrally supplying the fluid into a bottom of the well spaced beneath the heater element.

BRIEF DESCRIPTION OF THE DRAWINGS

Figure 1:
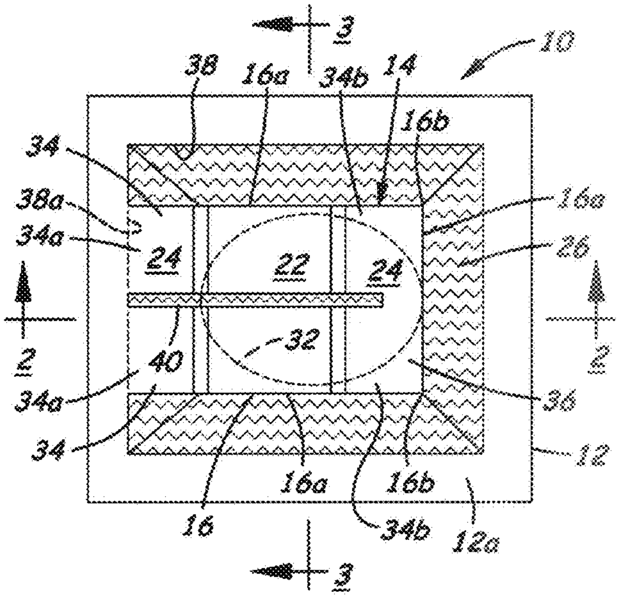

Having thus described the invention in general terms, reference will now be made to the accompanying drawings, which are not necessarily drawn to scale, and wherein:

FIG. 1 is a top plan view, not to scale, of a first exemplary embodiment of a heater stack of a micro-fluid ejection device in accordance with the present invention having a cantilever form of a floating electrical heater element.

Figure 2:
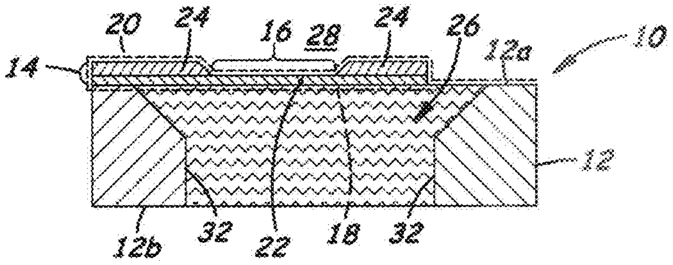

FIG. 2 is a first cross-sectional view of the floating heater stack taken along line 2-2 of FIG. 1.

Figure 3:
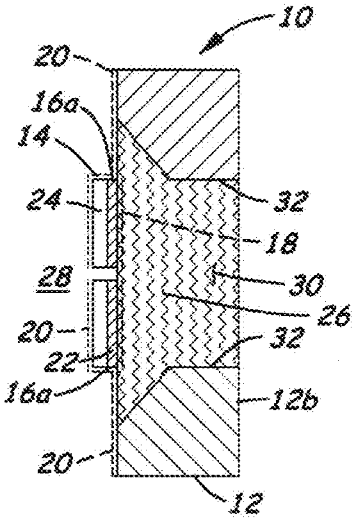

FIG. 3 is a second cross-sectional view of the floating heater stack taken along line 3-3 of FIG. 1.

Figure 4:
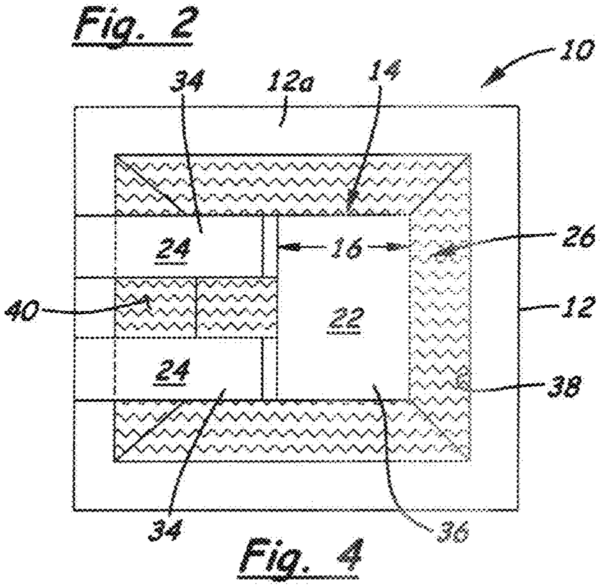

FIG. 4 is a top plan view, not to scale, of a second exemplary embodiment of a heater stack in accordance with the present invention being similar to that of FIG. 1 in also having a cantilever form of a floating heater element.

Figure 5:
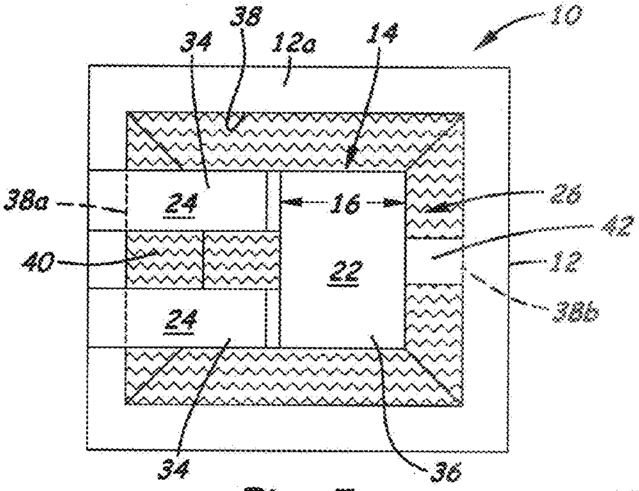

FIG. 5 is a top plan view, not to scale, of a first exemplary embodiment of a heater stack in accordance with the present invention having an alternative bridge form of a floating electrical heater element but otherwise substantially similar to the cantilever form of FIG. 4.

Figure 6:
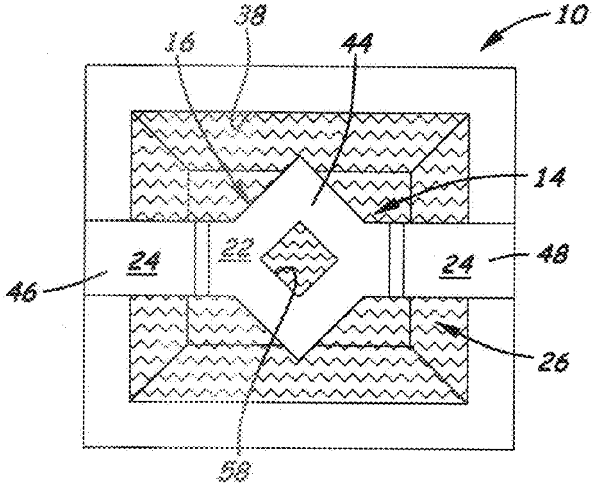

FIG. 6 is a top plan view, not to scale, of a second exemplary embodiment of a heater stack in accordance with the present invention having another alternative bridge form of the floating heater element with an enlarged diamond-shaped center.

Figure 7:
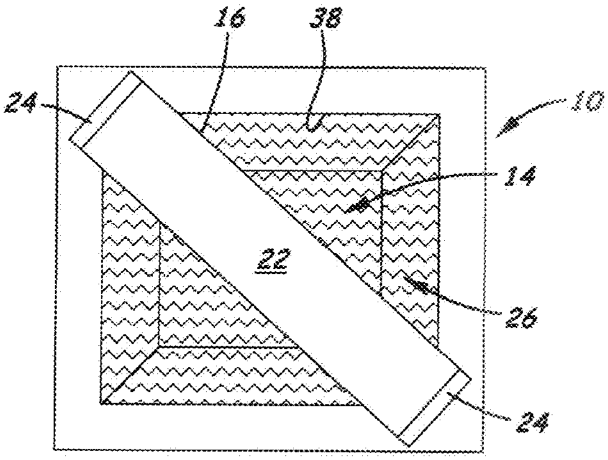

FIG. 7 is a top plan view, not to scale, of a third exemplary embodiment of a heater stack in accordance with the present invention having still another alternative bridge form of the floating heater element connected at both ends and angularly oriented diagonally at anisotropically etchable (45°) orientations relative to the silicon substrate.

Figure 8:
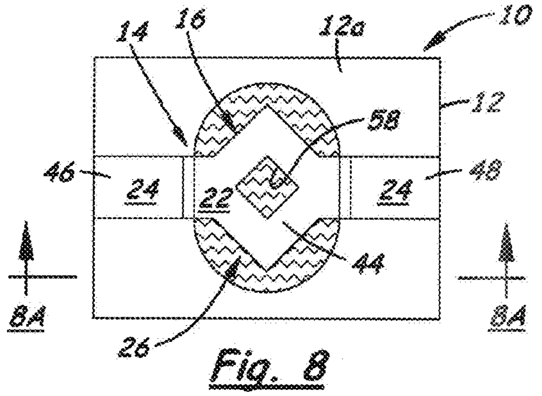

FIG. 8 is a top plan view, not to scale, of a fourth exemplary embodiment of a heater stack in accordance with the present invention having yet another alternative bridge form of the floating heater element with an enlarged diamond-shaped center.

Figure 8A:
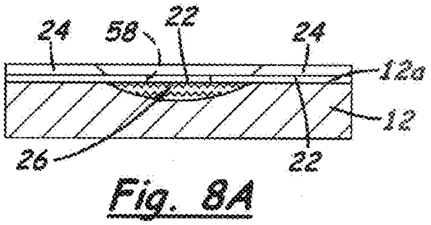

FIG. 8A is a side elevational view, not to scale, of the floating heater stack as seen along line 8A-8A of FIG. 8.

Figure 9:
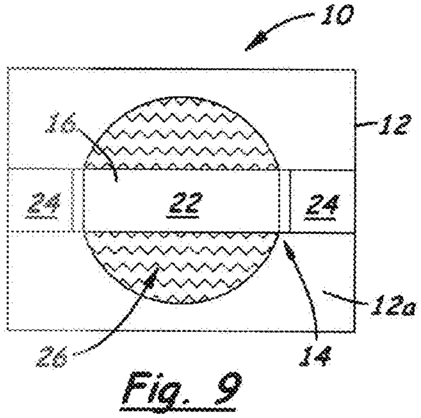

FIG. 9 is a top plan view, not to scale, of a fifth exemplary embodiment of a heater stack in accordance with the present invention having another alternative bridge form of the floating heater element connected at both ends with an overall rectangular shape.

Figure 10:
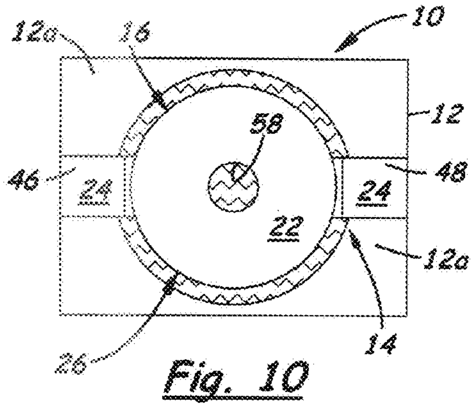

FIG. 10 is a top plan view, not to scale, of a sixth exemplary embodiment of a heater stack in accordance with the present invention having another alternative bridge form of the floating heater element with an enlarged circular-shaped center.

Figure 11:
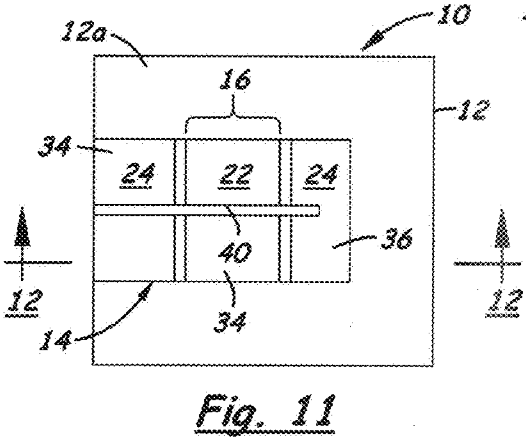

FIG. 11 is a top plan view, not to scale, of a schematic representation of the heater stack after a first stage of its formation in accordance with the method of the present invention.

Figure 12:
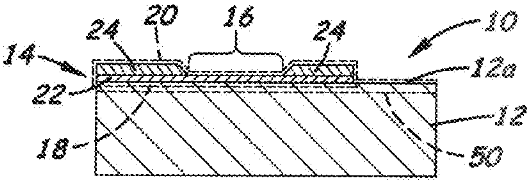

FIG. 12 is a cross-sectional view of the heater stack taken along line 12-12 of FIG. 11.

Figure 13:
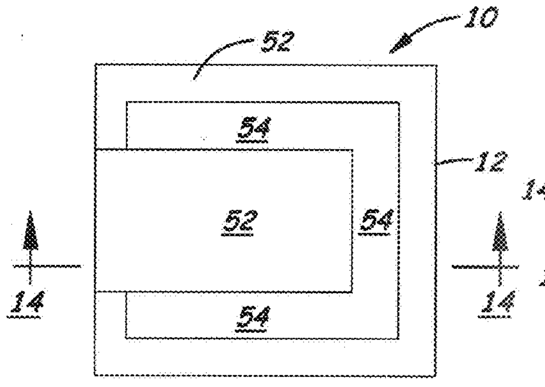

FIG. 13 is a top plan view, not to scale, of a schematic representation of the heater stack after a second stage of its formation in accordance with the method of the present invention.

Figure 14:
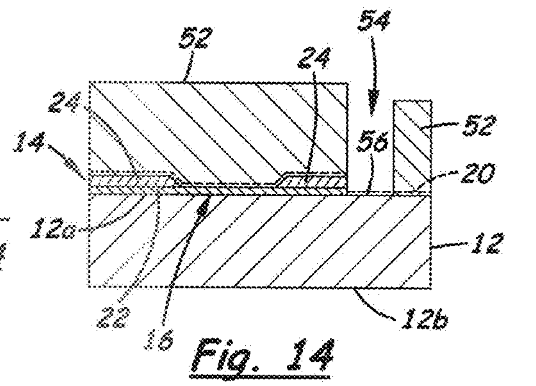

FIG. 14 is a cross-sectional view of the heater stack taken along line 14-14 of FIG. 13.

Figure 15:
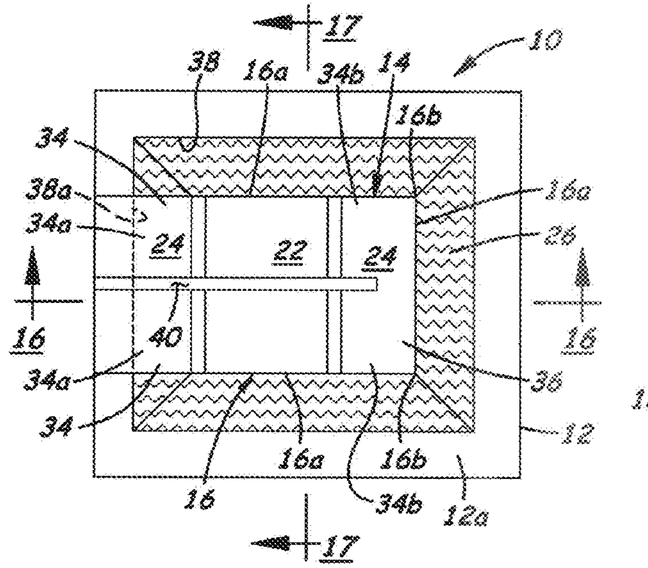

FIG. 15 is a top plan view, not to scale, of a schematic representation of the heater stack after a third stage of its formation in accordance with the method of the present invention.

Figure 16:
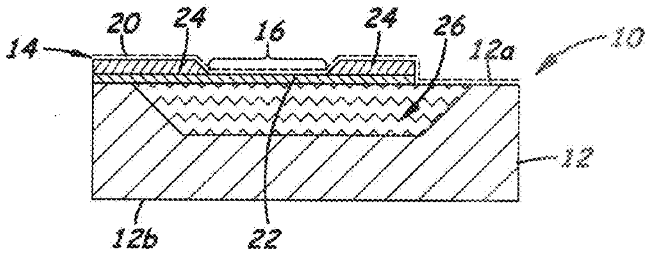

FIG. 16 is a first cross-sectional view of the heater stack taken along line 16-16 of FIG. 15.

Figure 17:
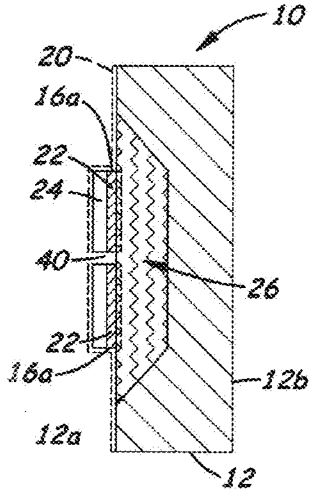

FIG. 17 is a second cross-sectional view of the heater stack taken along line 17-17 of FIG. 15.

DETAILED DESCRIPTION

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numerals refer to like elements throughout the views.

Also, the present invention applies to any micro-fluid ejection device, not just to heater stacks for thermal inkjet printheads. While the embodiments of the present invention will be described in terms of a thermal inkjet printhead, one of ordinary skill will recognize that the invention can be applied to any micro-fluid ejection system.

Referring now to FIG. 1-3, there is illustrated a first exemplary embodiment of a heater stack, generally designated 10, of a micro-fluid ejection device in accordance with the present invention. The heater stack 10 basically includes a substrate 12, in the form of a silicon wafer, and heater substrata 14 overlying the substrate 12 and configured to support and form a micro-fluid electrical heater element 16 in the heater stack 10. The electrical heater element 16 is responsive to repetitive electrical activation and deactivation to produce repetitive cycles of micro-fluid ejection from the ejection device. The heater stack 10 may also include undercoat and overcoat layers 18, 20 (indicated in dashed line form) disposed below and above the heater substrata 14 to provide protection of the heater element 16 from damage due to corrosion and cavitation, the well-known adverse effects of repetitive cycles of micro-fluid ejection. Each repetitive cycle involves alternating periods of heat-up and cool-down of the electrical heater element 16 and the fluid, such as ink, in the case of an inkjet printer.

More particularly, the heater substrata 14 are formed directly on a front side or surface 12*a* of the silicon substrate 12. The heater substrata 14 include a sequence of materials forming resistive and conductive layers 22, 24 on the front side or surface 12*a* of the silicon substrate 12. These layers 22, 24 support and form the electrical heater element 16 such that the heater element 16 has peripheral edge portions 16*a* and one or more convex corners 16*b*. A cavity or well 26 in the silicon substrate 12 undercuts the electrical heater element 16 and is open along the peripheral edge portions 16*a* and convex corners 16*b* of the heater element 16 such that it is in flow communication with an ejection chamber 28 above the heater stack 10 where a fluid is heated and ejected from the chamber.

The well 26 is capable of filling with the fluid (which can become heated also due to its contact with the fluid in the chamber 28 and with the heater element 16) so as to produce, in effect, a floating electrical heater element 16 on the silicon substrate 12 of the electrical heater stack 10.

Also, the heater stack 10 may have a bottom via 30 through which fluid is supplied to the well 26 and from there to the ejection chamber 28 above the heater stack 10. The via 30 thus may be formed through the silicon substrate 12 to the well 26 therein underneath the electrical heater element 16. The via 30 has a sidewall 32 extending from a back side **12*b* of the silicon substrate 12 toward the front side 12*a* thereof and to the well 26 underneath the heater element 16 for centrally supplying the fluid into a bottom 26*a* of the well 26 spaced beneath the heater element 16**.

Referring now to FIGS. 1-7, there are illustrated several exemplary embodiments of the heater substrata 14. In the exemplary embodiments of FIGS. 1-4, the heater substrata 14, and thus the floating electrical heater element 16 therein, are in a cantilever form. In the cantilever form, the resistive and conductive layers 22, 24 forming the floating electrical heater element 16 have a substantially U-shaped configuration formed by a pair of laterally spaced apart legs 34 and a bight 36 interconnecting corresponding one ends **34*a* of the legs 34 opposite from other ends 34*b* of the legs 34. The other ends 34*b* of the legs 34 are fixedly connected to a portion 38*a* of an endless edge 38 on the front side 12*a* of the silicon substrate 12 surrounding the well 26 underneath the heater substrata 14. The laterally spaced apart legs 34 define an elongated slot 40 in the heater substrata 14 between the bight 36 and the edge portion 38*a*. The exemplary embodiment of FIG. 5 is about the same as that of FIG. 4 except that the heater substrata 14 also include an oxide layer 42 which extends from the bight 36 in a direction opposite that of the legs 34 and is attached to an opposite portion 38*b* on the endless edge 38 of the silicon substrate 12 surrounding the well 26 underneath the heater substrata 14**.

In the other exemplary embodiments of FIGS. 6-10, the heater substrata 14, and thus the floating electrical heater element 16 therein, are in a bridge form as an alternative to that of FIGS. 1-5. In the alternative bridge form, the resistive and conductive layers 22, 24 forming the floating electrical heater element 16 have a substantially enlarged center 44 and a pair of legs 46, 48. The legs 46, 48 are attached at their remote ends to the opposite sides of the enlarged center 44, extend in opposite directions away from the center 44, and are attached to opposite portions **38*a*, 38*b* of the endless edge 38 of the silicon substrate 12 surrounding the well underneath the heater substrata 14. In FIGS. 6 and 8, the enlarged center 44 is diamond-shaped; in FIGS. 7 and 9, the heater element 16 is rectangular-shaped but oriented differently on the silicon substrate; and in FIG. 10, the enlarged center 44** is circular-shaped.

Turning now to FIGS. 11-17, a plurality of schematic representations are depicted of a sequence of stages in accordance with the method of the present invention for making a heater stack 10. Turning initially to FIGS. 11 and 12, there is illustrated the heater stack 10 after completion of a first stage of its formation in accordance with the method of the present invention. The first stage involves building the layers making up the heater substrata 14 of the heater stack 10. The substrate 12 is the base layer of silicon upon which all the other layers are deposited and patterned by using selected techniques of conventional thin film integrated circuit processing techniques, including layer growth, chemical vapor deposition, photoresist deposition, masking, developing, etching and the like. Thus, the silicon substrate 12 is processed to form the electrical heater stack 10 having the electrical heater element 16 formed on the silicon substrate 12 such that the heater element 16 has the peripheral edge portions **16*a* interconnected by at least one and preferably a plurality of convex corners 16*b*. Next, the heater or resistive layer 22 comprised of a first metal is deposited, followed by the conductor layer 24, comprised by a second metal typically selected from a wide variety of conductive metals, is deposited on the first metal resistive layer 22 to complete the deposition of the layers of the heater substrata 14. Undercoat and overcoat layers 18, 20 may also be deposited with the layers 24, 26 Once the resistive and conductor layers 22, 24 and overcoat and undercoat layers 18, 20 are deposited, they are patterned, masked and etched, in separate steps by conventional semiconductor processes, such as wet or dry etch techniques. In such manner, the etched first resistive metal layer 22 provides the fluid heater element 16 of the heater stack 10 and the etched second conductor metal layer 24 provides the power and ground leads for the resistive heater element 16. The resistive and conductor layers 22, 24** may be selected from materials and may have thicknesses such as set forth in above cited U.S. Pat. No. 7,195,343.

Turning now to FIGS. 13 and 14, there is illustrated the heater stack 10 after completion of a second stage of its formation in accordance with the method of the present invention. The second stage involves processing the electrical heater stack 10 by depositing and patterning a layer 52 of photoresist thereon to substantially cover and mask the electrical heater stack 10. In the processing, a trench 54 is formed through the photoresist layer 52 that exposes an area 56 of the front surface **12*a* of the silicon substrate 12 at the bottom of the trench 54 which extends along the peripheral edge portions 16*a* and around the convex corners 16*b* of the electrical heater element 16. The photoresist layer 52 will act as the mask for the undercutting performed during the third stage. An alternative to depositing and patterning the layer 52 of photoresist is to employ a hard mask applied during the initial processing of the heater element 16 on the silicon substrate 12. The hard mask used may be the overcoat layer 20** of SiN, SiO2, SiC, etc. The deposition of the hard mask can be the last step of the CMOS process and may also be used as a functional protective overcoat or PO.

Turning now to FIGS. 15-17, there is illustrated the heater stack 10 after completion of a third stage of its formation in accordance with the method of the present invention. The third stage involves processing the masked electrical heater stack 10 and exposed front side or surface area 56 of the silicon substrate 12 by removing sequentially the layer of photoresist and portions of the silicon substrate at the exposed first surface area thereof and that underlie the electrical heater element so as to create a well in the silicon substrate undercutting the electrical heater element and open along the peripheral edge portions and convex corner of the electrical heater element, the well capable of filling with a fluid so as to produce, in effect, a floating electrical heater element on the silicon substrate of the electrical heater stack.

For producing the exemplary embodiments of FIGS. 1-7, the layer of photoresist 52 and the portions of the silicon substrate 12 at the exposed front surface area 56 and that underlie the electrical heater element 16 are sequentially removed by performance of anisotropic wet chemical etching. Anisotropic wet chemical etching works to undercut the heater element 16 due to the presence of the convex corners **16*b* thereon, as shown in FIGS. 1 and 4-6, or diagonal (45°) orientation of edges thereon, as shown in FIG. 7. Convex corners or diagonally oriented edges on the heater element 16** can be rapidly undercut, in contrast to concave corners, because of the planes of the silicon crystal structure exposed at the convex corners and diagonal edges etch at much faster rates when using an anisotropic etchant than the planes exposed at concave corners. Chemistries used commercially for bulk anisotropic silicon etching include alkali-OH (e.g. KOH, NaOH), ethylene diamine pyrochatechol (EDP), or tetramethylammonium hydroxide (TMAH). If an oxide layer is still present over the silicon surface it should first be removed with a wet or dry etchant. Cantilevers are common microelectromechanical (MEMS) structures that are feasible due to the presence of convex corners. See pages 275-6 of *Introduction to Microelectronic Fabrication* $2^{nd}$ *Edition* by Richard C. Jaeger, published by Prentice Hall in 2002. However, this prior art reference does not anticipate nor suggest application of convex corners or diagonal edges and anisotropic wet chemical etching to micro-fluid ejection devices, such as inkjet printer chips to produce floating electrical heater elements 16 in their heater stacks 10.

For producing the exemplary embodiments of FIGS. 8-10, the layer of photoresist 52 and the portions of the silicon substrate 12 at the exposed front surface area 56 and that underlie the electric heater are sequentially removed by performance of by isotropic wet or dry chemical etching. Isotropic wet chemical etching works to undercut the heater element 16 of the exemplary embodiments shown in FIGS. 8, 9 and 10. The etching will be a timed etch when utilizing an isotropic etch. The timing will depend on the diameter of the well 26 that is being created. Isotropic wet etchants include a mixture of nitric acid ($HNO_3$), hydrofluoric acid (HF), and acetic acid ($CH_3COOH$). A dry isotropic etchant may be XeF2.

Finally, referring again to FIGS. 1-3, there is also illustrated the heater stack 10 after completion of a fourth stage of its formation in accordance with the method of the present invention. The fourth stage involves removing portions of the silicon substrate 12 at the back side or surface 12*b* opposite from the front surface 12*a* thereof to produce the bottom via 30 through the silicon substrate 12 to the well 26 therein underneath the electrical heater element 16. By the performance of deep reactive ion etching from the back side or surface 12*b* of the silicon substrate 12, the sidewall 32 is produced, extending from the back surface 12*b* of the silicon substrate 12 toward the front surface 12*a* thereof and to the well 26 underneath the heater element 16 for centrally supplying the fluid into the bottom of the well 26.

To summarize, the present invention is directed to the heater stack 10 and method for forming an ultra-low energy inkjet heater element 16 with the presence of a cavity or well 26 beneath it formed in the silicon substrate 12 of the heater chip. Such a structure of heater element 16 demonstrates greatly improved thermal efficiency relative to current designs due to the dramatic reduction of waste heat into the materials under the heater and increased bubble nucleation area. The key advantages of this invention are: (1) much lower energy, as much as 40% less based on simulations with the current design, could be used to fire the heater, thereby reducing the thermal dissipation requirements of the chip and enabling faster printing with small drops; (2) ability to be integrated with conventional inkjet chip manufacturing rather than the development of a MEMS-based chip with new processes and materials; and (3) achievement of a ultra low energy (ULE) heater without the complexity of integrating a thermally unstable material under the heater.

The foregoing description of several embodiments of the invention has been presented for purposes of illustration. It is not intended to be exhaustive or to limit the invention to the precise forms disclosed, and obviously many modifications and variations are possible in light of the above teaching. It is intended that the scope of the invention be defined by the claims appended hereto.

What is claimed is:

1. A heater stack in a micro-fluid ejection device, comprising:

a silicon substrate;

a heater substrata of resistive and conductive layers on a front side of said silicon substrate supporting and forming an electrical fluid heater element having peripheral edge portions defining at least two opposite sides and a bight with a distal end opposite a proximate end, the resistive and conductive layers having a substantially U-shaped configuration wherein the conductive layers define a pair of laterally spaced apart legs at the proximate end of the fluid heater element to energize the fluid heater element;

an anisotropically etched well formed in said silicon substrate undercutting said electrical fluid heater element and open along said peripheral edge portions at the at least two opposite sides and the distal end of said electrical fluid heater element and between the pair of laterally spaced apart legs of the conductive layers, said well capable of filling with a fluid so as to produce, in effect, a floating electrical heater element on said silicon substrate of said electrical heater stack; and a via form through said silicon substrate to said well therein underneath said electrical heater element having a sidewall extending from a back side of said silicon substrate toward said front side thereof and to said well underneath said heater element for centrally supplying the fluid into a bottom of said well spaced beneath said heater element.

2. The stack of claim 1 wherein said bight interconnects corresponding one ends of the laterally spaced apart legs opposite from other ends of the laterally spaced apart legs being connected to a portion of an edge of said silicon substrate surrounding said well underneath said heater substrata.

3. The stack of claim 2 wherein said heater substrata also have an oxide layer extending from said bight in a direction opposite that of said legs such that said oxide layer extends and is attached to an opposite portion on said edge of said silicon substrate surrounding said well underneath said heater substrata.

4. The stack of claim 1 wherein said heater substrata of resistive and conductive layers forming said electrical heater element have a substantially enlarged center and a pair of legs attached at opposite sides of said enlarged center and extending in opposite directions therefrom and being attached to opposite portions of an edge of said silicon substrate surrounding said well underneath said heater substrata.

5. The stack of claim 4 wherein said enlarged center is one of diamond-shaped or circular-shaped.

6. The stack of claim 1 wherein said heater substrata of resistive and conductive layers forming said electrical heater element extends diagonally across said well and is attached to opposite portions of an edge of said silicon substrate surrounding said well underneath said heater substrata.

* * * * *